(12) United States Patent
Shang

(10) Patent No.: US 7,405,415 B2
(45) Date of Patent: Jul. 29, 2008

(54) ION SOURCE WITH PARTICULAR GRID ASSEMBLY

(75) Inventor: Chang Chen E Shang, Taichung (TW)

(73) Assignee: Asia Optical Co., Inc., Taichung (TW)

( * ) Notice: Subject to any disclaimer, the term of this patent is extended or adjusted under 35 U.S.C. 154(b) by 577 days.

(21) Appl. No.: 11/055,692

(22) Filed: Feb. 11, 2005

(65) Prior Publication Data

US 2006/0017011 A1   Jan. 26, 2006

(30) Foreign Application Priority Data

Jul. 22, 2004   (TW) .............................. 93121851 A

(51) Int. Cl.
*A61N 5/00* (2006.01)

(52) U.S. Cl. ............ 250/492.3; 250/492.1; 315/111.31; 315/111.81

(58) Field of Classification Search ... 250/492.1–492.3; 315/11.31, 111.81
See application file for complete search history.

(56) References Cited

U.S. PATENT DOCUMENTS

| | | | |
|---|---|---|---|
| 4,446,403 A | 5/1984 | Cuomo et al. | |
| 4,873,467 A | 10/1989 | Kaufman et al. | |
| 6,319,326 B1 | 11/2001 | Koh et al. | |
| 6,346,768 B1 * | 2/2002 | Proudfoot | ................ 313/359.1 |
| 6,378,290 B1 | 4/2002 | Killinger et al. | |
| 2007/0076833 A1 * | 4/2007 | Becker et al. | ................ 375/377 |

* cited by examiner

*Primary Examiner*—Jack I. Berman
*Assistant Examiner*—Andrew Smyth

(57) ABSTRACT

An ion source (1) to be used in optical thin film deposition by IAD process includes a discharge chamber (10), a gas source, an actuator (11), a grid assembly (20) and an outer shell (30). The grid assembly includes a screen grid (21), an accelerator grid (22) and a decelerator grid (23). The screen grid is kept at anode potential and is disposed near the ions. The accelerator grid is kept at cathode potential and is spaced from the screen grid. The decelerator grid is equal to the ground and is disposed beyond the accelerator grid. Each grid has a curved central portion (24) defining a plurality of apertures aligned with those of the other two grids to form extraction channels for an ion beam (40). When disposing the grid assembly at one end of the discharge chamber, the curved central portions of the three grids are arranged in an inwardly curved manner toward the interior of the discharge chamber, and thus the ion beam is extracted from the grid assembly in a converged manner to have a sequentially reduced cross-sectional area.

12 Claims, 5 Drawing Sheets

ION SOURCE WITH PARTICULAR GRID ASSEMBLY

BACKGROUND OF THE INVENTION

1. Field of the Invention

The present invention relates to an ion source, and particularly relates to an ion source with a particular grid assembly, which is intended to be used in optical thin film deposition.

2. Description of Prior Art

Currently, optical thin film coating technology has been widely applied in high technology fields, such as laser optics and fiber communications fields. A thin film coating can be either a single-layer or a multi-layer coating on a substrate where several thin films are deposited on top of one another to achieve the required reflection/transmission via interference effects. The substrate may be a glass, metal, ceramic, or plastic substrate. An optical glass substrate is the most commonly used substrate. Each layer of the thin film coating is very thin, typically in the range between several nanometers and several microns. The number of layers may be one or a few hundreds. One of the applications of optical thin film coating is the optical filter, which is formed by depositing multiple layers of metal or medium materials on an optical substrate.

PVD (Physical Vapor Deposition) and CVD (Chemical Vapor Deposition) are two most common types of optical thin film coating method. PVD embraces evaporative deposition, sputtering and ion plating in reactive or inert environments. The evaporative deposition is generally carried out under a pressure of $10^{-3}$ to $10^{-4}$ Pa. The following sequential basic steps take place during evaporative deposition: a vapor is generated by boiling or subliming a source material; the vapor is transported from the source to the substrate; and the vapor is condensed to a solid film on the substrate surface. Sputtering deposition applies an inert gas at 10~1 Pa in the vacuum chamber. The material to be sputtered is the cathode. The substrate to be coated is placed on the grounded anode. A glow discharge is formed by applying a high voltage between the anode and cathode. An electron source supports ionization of the inert gas, and the positively charged ions are accelerated towards the cathode. These ions bombard the cathode material with high energy and force atoms and molecules to break away from the cathode by virtue of their kinetic energy. Some of these sputtered particulates are intercepted by the substrate and form a uniform thin film layer. Ion plating is based on the evaporative deposition technology. In ion plating process, positive ions are produced in a glow discharge and are attracted to the substrate, which is connected as the cathode. The ions are typically made by evaporation.

As the quality requirements for optical thin film on optical components are becoming more and more stringent, an ion source (ion gun) is typically employed in the film coating process to improve the film quality. The film coating processes applying ion source include Ion Assisted Deposition (IAD), reactive ion plating, and so on. The IAD process has been especially effective in depositing dense coatings for optical coating applications. Bombardment can be done using a beam of condensable "film-ions" from an ion source (ion gun) disposed in a vacuum chamber and being independent from the source material. Ion bombardment of the substrate and the growing film adds thermal energy to the surface region without having to heat the bulk of the material. The ion bombardment also causes atomic rearrangement in the near-surface region during deposition, which increases the film density. This technology has the advantage of providing excellent control of deposition parameters. In addition, the coating of temperature-sensitive substrates, such as plastic, glass and semiconductor substrates, is possible with IAD processes because heating of the substrates is no longer necessary.

Broad beam ion sources used in IAD technology include Kaufman-type ion sources (referring to U.S. Pat. No. 4,446,403), cold hollow cathode type broad ion sources, RF ion sources, and gridless End-Hall ion sources. The type of ion source to which the target is connected depends heavily on the element to be ionized. Another important quantity is the beam purity that the ion-source selection most often determines.

FIG. 1 is a schematic block diagram of a conventional high-frequency ion source for explaining the operational functions of such a high-frequency ion source. FIG. 2 shows a cross-sectional representation of a discharge chamber of a conventional high-frequency (or radio-frequency) ion source 9 disclosed in U.S. Pat. No. 6,378,290, which is an improvement on that shown in FIG. 1. This conventional ion source 9 of the '290 patent includes a discharge chamber 90 at a closed end, a source 94 (shown in FIG. 1) for the gas to be ionized, a gas inlet 91 for supplying into the discharge chamber 90 the gas to be ionized, a high-frequency coil 92 surrounding the discharge chamber 90, a high-frequency generator 95 (shown in FIG. 1) connected to the high-frequency coil 92, for generating a high-frequency electromagnetic alternating field which ionizes the gas present in the discharge chamber 90, and an acceleration grid assembly 93 arranged at an open end of the discharge chamber 90 and connected to an acceleration voltage source 96 (shown in FIG. 1). The discharge chamber 90 is made of an electrically non-conductive material. The high-frequency coil 92 generates a high-frequency field, which ionizes a propellant present in the discharge chamber 90, preferably an inert gas. To ignite the discharge, free electrons supplied by an external electron source are accelerated through the high-frequency field, and collide with neutral propellant particles, i.e., inert gas atoms. When the discharge has ignited, it sustains itself, there is no need for any external supply of electrons. A plasma, comprising ions, electrons and neutral propellant, is finally generated in the discharge chamber 90. The fraction of ions in the plasma is determined by the output provided by the high-frequency field. Ions present near the acceleration grid assembly 93 are accelerated by the electrical field generated by the acceleration voltage, with a focused ion beam being formed. The acceleration grid assembly 93 comprises two to three thin plates each made of an electrically conductive material, with a plurality of holes provided therein. These holes are arranged so as to form extraction channels, which focus and accelerate the ions in the form of an ion beam emanating from the discharge chamber 90. Configurations of the plates forming a conventional acceleration grid assembly are also disclosed in U.S. Pat. No. 4,873,467.

A schematic diagram of a conventional radio-frequency (RF) ion source is shown in FIG. 3 to further illustrate the working status of such an RF ion source in detail. This RF ion source 8 comprises a discharge chamber 80 of an electrically non-conductive material, a gas inlet 81 communicating with the discharge chamber 80, an RF coil 82 surrounding the discharge chamber 80, a grid assembly provided at an open end of the discharge chamber 80, and an outer shell 83 surrounding the discharge chamber 80 and the RF coil 82. The outer shell 83 serves to provide shielding to the exterior of the electromagnetic fields generated in the discharge chamber 80, and to provide heat dissipation to the exterior of the loss heat arising during ionization. The grid assembly includes a screen grid 84 having apertures and disposed near the plasma in the discharge chamber 80, an accelerator grid 85 having apertures aligned with those of the screen grid 84, and a decelerator grid 86 beyond the accelerator grid 85. The screen grid 84 is kept at anode potential, the accelerator grid 85 is kept at cathode potential, and the decelerator grid 86 is equal to the ground. When the ions reach the screen grid 84, a strong electrical field generated between the screen grid 84 and the accelerator grid 85 extracts and accelerates the ions in the form of an ion beam. The decelerator grid 86 is adapted to better control the focusing of the ion beam, yield better uniformities and reduce erosion of the accelerator grid 85.

The above ion beam accelerated by the grid assembly will directly bombard the substrate and the growing film on the substrate, thereby adjusting the surface characteristics of the substrate. However, the ion beam tends to diverge or becomes larger due to the mutual repulsion of ions bearing the same charge. U.S. Pat. No. 6,319,326 discloses such an ion beam, which may be called a diverged ion beam. FIG. 4 shows another conventional ion source 7 used in the IAD process for filter manufacturing. Materials of high reflectivity and low reflectivity are sublimed and deposited on a glass substrate 70. The grid assembly 71 of the ion source 7 consists of three grids. Each grid is made of molybdenum and is curved at a central portion 72 thereof. The three grids of the grid assembly 71 are stacked with one another, and are spaced and insulated from one another by insulators positioned therebetween. The grid assembly 71 is disposed at an open end of the discharge chamber 73 in an outwardly curved profile, whereby the ion beam 74 diverges outwardly from the grid assembly 71 with a sequentially increased cross-sectional area. Although the surface area of the substrate 70 is entirely covered by the ion beam 74, this large cross-sectional area of the ion beam 74 disadvantageously causes energy loss and thus loss of adhesion of the resultant layer over the substrate 70 due to deposition density reduction. This results in reduced yield and throughput, which is unwanted.

Accordingly, an improved grid assembly for IAD application is desired to increase the yield and throughput of the resultant product.

SUMMARY OF THE INVENTION

Accordingly, one object of the present invention is to provide an ion source with a particular grid assembly, which is intended to be used in optical thin film deposition by IAD process.

Another object of the present invention is to provide an ion source with a particular grid assembly. This particular grid assembly focuses the extracted ions into a converged ion beam for energy concentration, thereby increasing the thin film deposition throughput and yield, and thus decreasing the production cost.

To achieve the above objects of the present invention, an ion source with a particular grid assembly in accordance with the present invention, which is intended to be used in optical thin film deposition by IAD process, comprises a discharge chamber for receiving an ionizable gas and a plasma resulting from the ionized gas, an ionizable gas source for supplying the ionizable gas into the discharge chamber, an actuator for generating a high-frequency electromagnetic alternating field, a grid assembly for extracting and accelerating the ions in the form of an ion beam, and an outer shell surrounding the discharge chamber and the actuator. The grid assembly includes a screen grid, an accelerator grid and a decelerator grid. The screen grid is kept at anode potential and is disposed near the plasma in the discharge chamber. The accelerator grid is kept at cathode potential and is spaced from the screen grid. The decelerator grid is equal to the ground and is disposed beyond the accelerator grid. Each grid has a curved central portion with a plurality of apertures defined therethrough and aligned with those of the other two grids. These apertures are arranged so as to form extraction channels, which focus and accelerate the ions in the form of an ion beam departing from the discharge chamber. The grid assembly is arranged at an open end of the discharge chamber in an inwardly curved profile, whereby the ion beam is extracted from the grid assembly in a converged manner. That is, the ion beam has a sequentially reduced cross-sectional area.

The screen grid, accelerator grid and decelerator grid of the grid assembly are assembled to each other by screws, insulators, pads and nuts. Thus, these grids are spaced and insulated from each other. The grid assembly is disposed at the open end of the discharge chamber in an inwardly curved profile facing the interior of the discharge chamber, whereby the ion beam is converged to concentrate energy.

Since the grid assembly of the ion source of the present invention is disposed at the open end of the discharge chamber in an inwardly curved profile, a converged ion beam is obtained, and thus the quality of the resultant thin film is improved due to deposition density increase, thereby increasing throughput and yield of the thin film.

BRIEF DESCRIPTION OF THE DRAWINGS

The present invention may best be understood through the following description with reference to the accompanying drawings, in which.

DETAILED DESCRIPTION OF THE INVENTION

Figure 1:
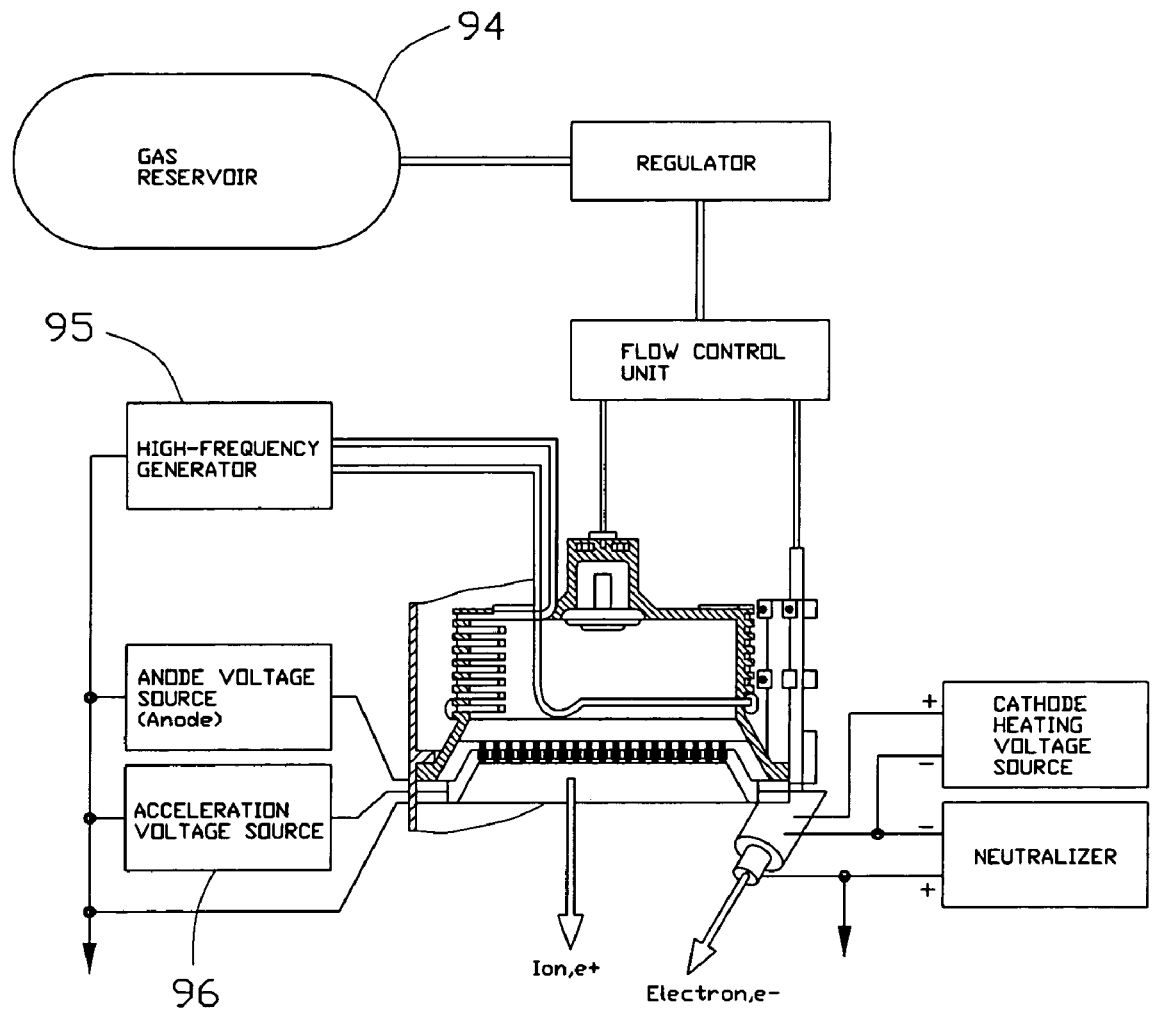
FIG. 1 is a schematic block diagram of a conventional high-frequency ion source for explaining the operational functions of such a high-frequency ion source.
Figure 2:
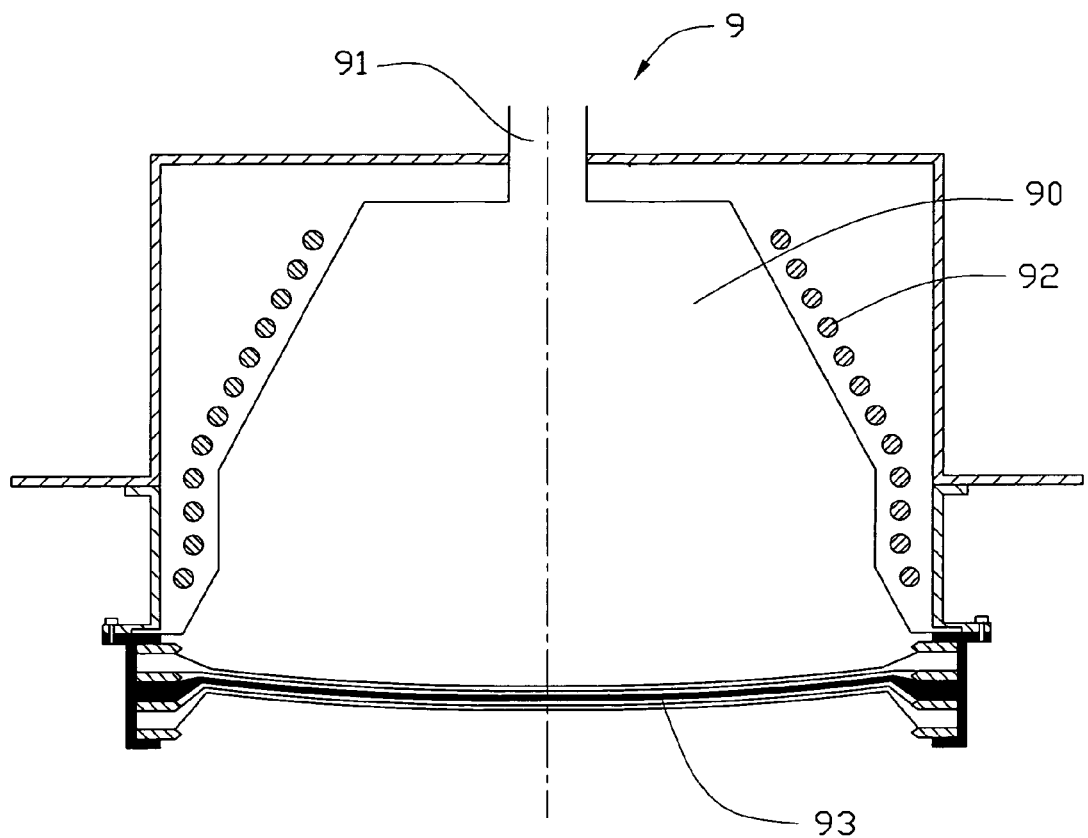
FIG. 2 is a cross-sectional representation of a discharge chamber of a conventional radio-frequency ion source.
Figure 3:
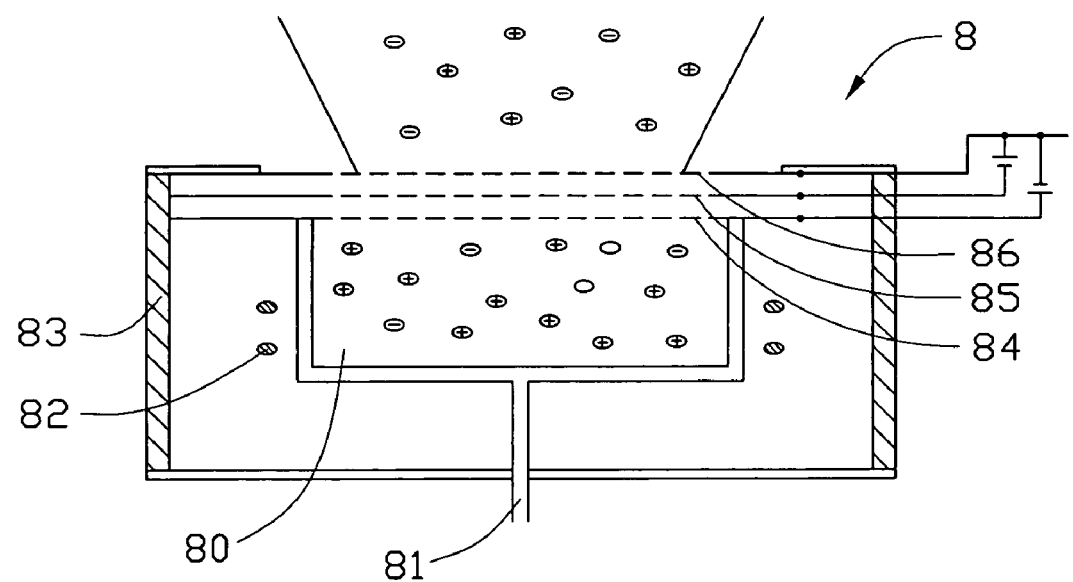
FIG. 3 is a cross-sectional representation of another conventional radio-frequency ion source extracting a diverged ion beam.
Figure 4:
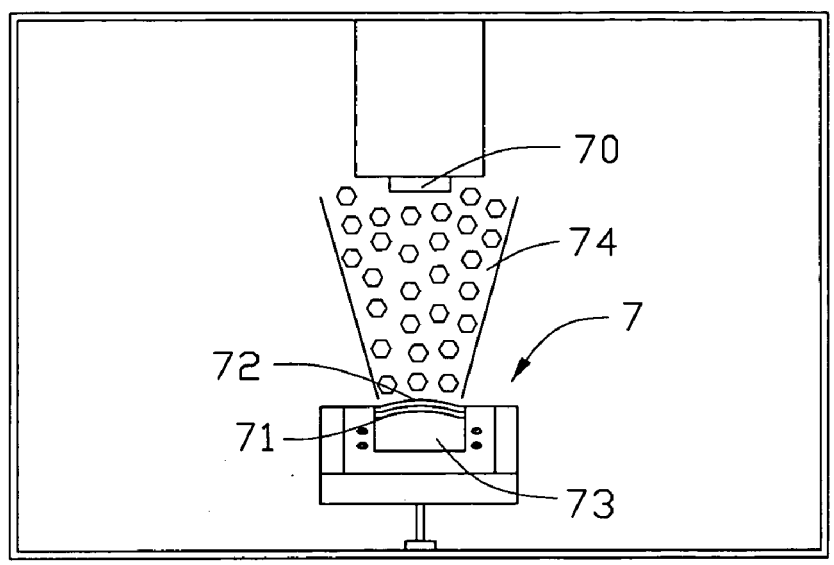
FIG. 4 is a schematic diagram of a further conventional ion source with an outwardly curved grid assembly extracting a diverged ion beam.
Figure 6:
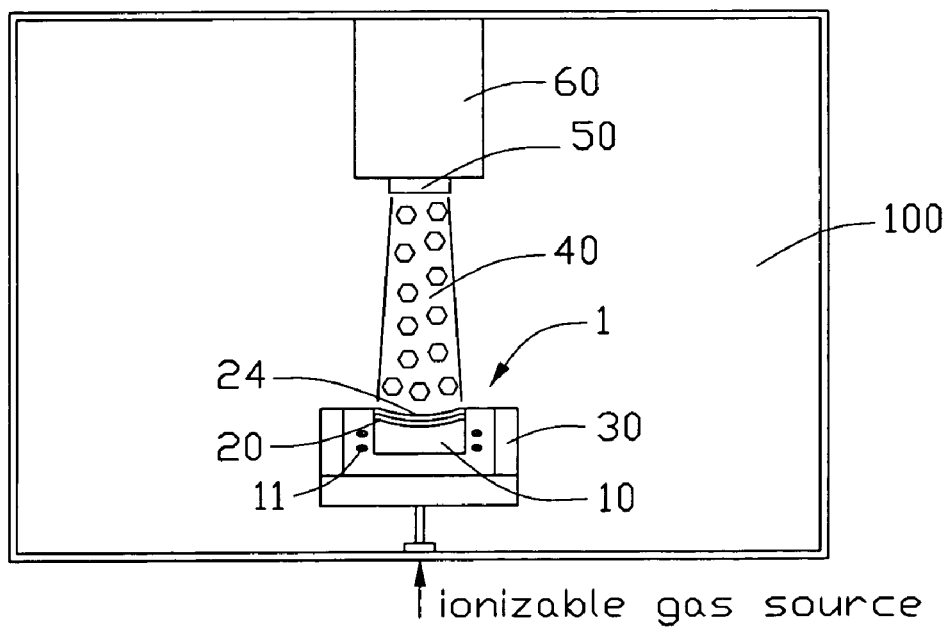
FIG. 6 is a schematic diagram of the present ion source, showing the grid assembly thereof is disposed in an inwardly curved manner for extracting a converged ion beam.
Figure 5:
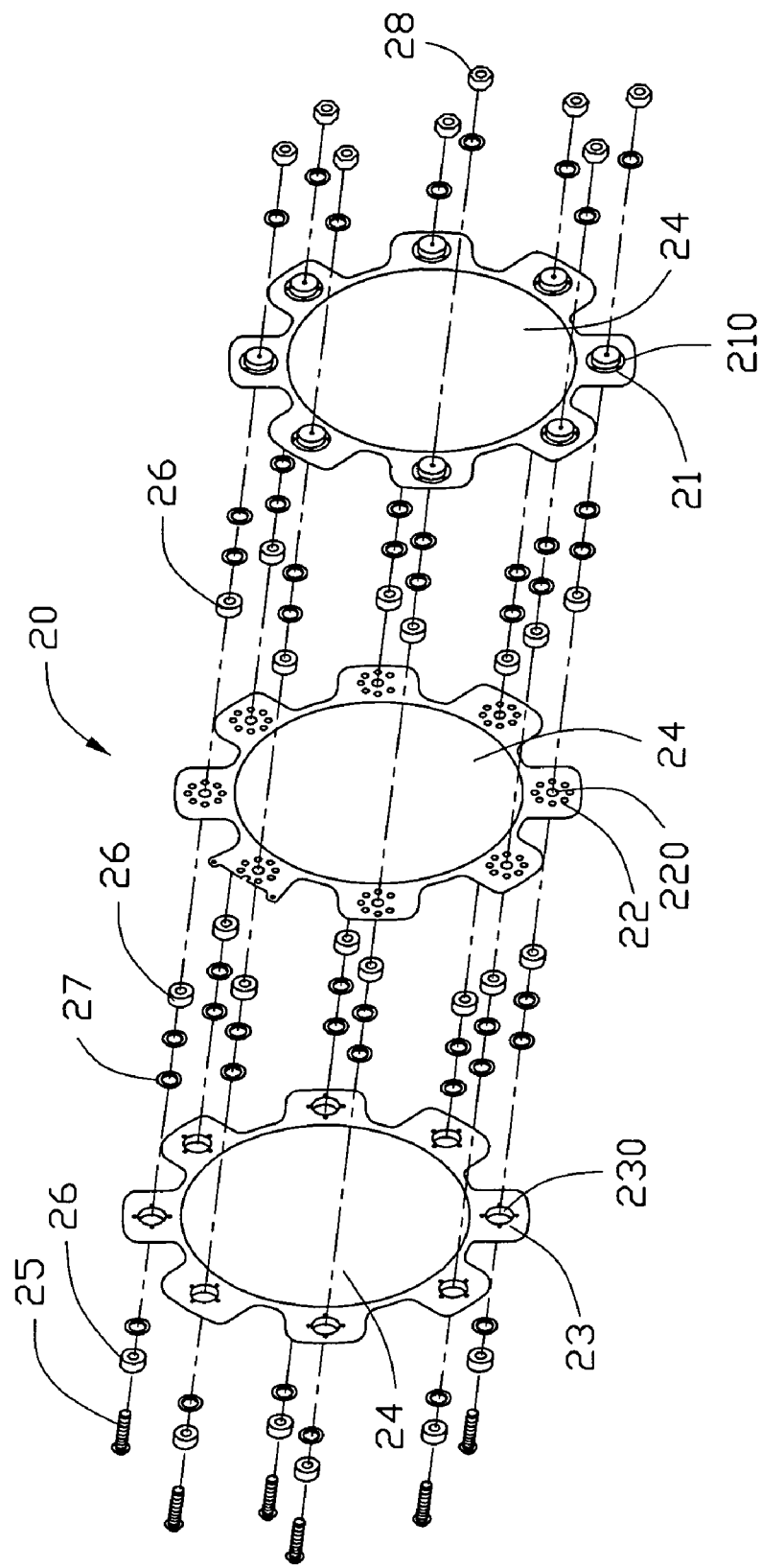
FIG. 5 is an exploded view of a grid assembly of the ion source in accordance with the present invention.

Referring to FIGS. 5 and 6, an ion source 1 in accordance with the present invention has a configuration similar to that of the prior art. The ion source 1 is positioned in a deposition chamber or vacuum chamber 100 and is intended for optical thin film deposition by IAD process. The ion source 1 includes a discharge chamber or plasma chamber 10, an ionizable gas source for supplying ionizable gas into the discharge chamber 10, an actuator 11 positioned around the discharge chamber 10, an ion beam extraction device arranged at an open end of the discharge chamber 10, and an outer shell 30 surrounding the discharge chamber 10 and the actuator 11. The discharge chamber 10 is made of an electrically non-conductive material. The outer shell 30 may be made of metal. The actuator 11 may be in the form of an RF coil connected to a high frequency generator (shown in FIG. 1) for generating a high-frequency electromagnetic alternating field, which ionizes the gas present in the discharge chamber 10 to form the plasma.

The ion beam extraction device is in the form of a grid assembly 20 as clearly shown in FIG. 5. The grid assembly 20 includes a screen grid 21, an accelerator grid 22, and a decelerator grid 23 for improving the quality of the accelerated ion beam. The screen grid 21 is kept at anode potential and is disposed near the plasma in the discharge chamber 10. The accelerator grid 22 is kept at cathode potential and is spaced from the screen grid 21. The decelerator grid 23 is equal to the ground and is disposed beyond the accelerator grid 22. The three grids have similar configurations. Each grid has a peripheral portion assembled to the sidewall of the discharge chamber 10, and a central portion 24 for contact with the plasma in the discharge chamber 10. As clearly shown in FIG. 6, the central portion 24 of each grid is curved with a plurality of apertures (not shown for simplicity) defined therethrough and aligned with those of the other two grids. These apertures are arranged so as to form extraction channels, which focus and accelerate the ions. The screen grid 21, accelerator grid 22 and decelerator grid 23 of the grid assembly 20 are assembled together as a unit in a conventional manner. This assembly is achieved by extending screws 25 into apertured insulators 26, apertured pads 27, holes 230, 220, 210 in the peripheral portions of the respective screen grid 21, accelerator grid 22 and decelerator grid 23, and finally into nuts 28. Thus, these grids are spaced and insulated from each other. The assembled grid assembly 20 is then disposed at the open end of the discharge chamber 10. When the ions reach the screen grid 21, a strong electrical field generated between the screen grid 21 and the accelerator grid 22 extracts and accelerates the ions in the form of an ion beam 40 departing from the discharge chamber 10. The decelerator grid 23 is adapted to better control the focusing of the ion beam 40, yield better uniformities and reduce erosion of the accelerator grid 22.

As clearly shown in FIG. 6, the ion source 1 of the present invention is different from the prior art in that the curved central portion 24 of each grid 21, 22, 23 is arranged at the open end of the discharge chamber 10 in an inwardly curved profile facing the interior of the discharge chamber, whereby the ion beam 40 is extracted from the grid assembly 20 in a converged manner. That is, the ion beam 40 has a sequentially reduced cross-sectional area. This converged ion beam 40 directly bombards the glass substrate 50 to expedite film growing on the substrate surface. The glass substrate 50 is fixed to a rotating fixture 60 for ensuring deposited film uniformity.

Since the ion beam 40 extracted by the grid assembly 20 of the ion source 1 of the present invention is converged to have a sequentially reduced cross-sectional area, the deposition energy is more concentrated on the substrate surface while ensuring coverage of the entire surface area of the substrate 50. Thus, energy loss caused by a conventional ribbon-type ion beam can be efficiently prevented. Accordingly, the quality of the resultant thin film can be significantly improved since adhesion of the resultant layer over the substrate 50 is increased due to deposition density increase, and thus high throughput and yield of the thin film can be ensured.

It should be noted that the ion source used in IAD process may be a Kaufman-type ion source or an RF ion source. The type of ion source determines the number of grids. Generally, the Kaufman-type ion source has a single-grid configuration and the RF ion source has a three-grid configuration. Accordingly, the above-mentioned grid assembly 20 is for an RF ion source. However, it is understandable that the inwardly-curved configuration of the grid assembly 20 may also be applied to grids of an ion source of other type.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An ion source to be used in optical thin film deposition by IAD process, comprising:
    a discharge chamber for containing an ionizable gas and a plasma resulting from the ionized gas;
    a gas source for supplying the ionizable gas;
    an actuator for generating a high-frequency electromagnetic alternating field to ionize the ionizable gas and thus produce a plasma in the discharge chamber;
    a grid assembly for extracting and accelerating the ions in the form of an ion beam, the grid assembly comprising a screen grid kept at anode potential and disposed near the plasma in the discharge chamber, an accelerator grid kept at cathode potential and spaced from the screen grid, and a decelerator grid being equal to the ground and disposed beyond the accelerator grid, each grid having a curved portion with a plurality of apertures defined therethrough, the apertures of the three grids being aligned with each other to form extraction channels for the ion beam; wherein the screen grid, the accelerator grid and the decelerator grid are assembled into the grid assembly via a screw-nut engagement therebetween, the three grids being spaced and insulated from one another, and wherein, when disposing the grid assembly at the discharge chamber, the curved portions of the three grids of the grid assembly are arranged in an inwardly curved manner toward the interior of the discharge chamber, and thus the ion beam is extracted from the grid assembly in a converged manner to have a sequentially reduced cross-sectional area; and
    an outer shell surrounding the discharge chamber and the actuator.

2. The ion source as claimed in claim 1, wherein the discharge chamber has a gas inlet for allowing passage of the ionizable gas thereinto, and an opposite open end where the grid assembly is disposed.

3. The ion source as claimed in claim 2, wherein the discharge chamber is made of an electrically non-conductive material.

4. The ion source as claimed in claim 2, wherein the outer shell is made of metal, and serves to provide shielding to the exterior of the electromagnetic fields generated in the discharge chamber and to provide heat dissipation to the exterior of the loss heat arising during ionization.

5. The ion source as claimed in claim 2, wherein the actuator is in the form of a radio frequency coil surrounding the discharge chamber and connected to a high frequency generator.

6. An ion source with a grid assembly to be used in thin film deposition on a substrate, comprising:
    a discharge chamber for containing an ionizable gas and a plasma resulting from the ionized gas; and
    a grid assembly disposed at the discharge chamber, the grid assembly comprising a screen grid kept at anode potential and disposed near the plasma, an accelerator grid kept at cathode potential and spaced from the screen grid, and a decelerator grid being equal to the ground and disposed beyond the accelerator grid, each grid having a peripheral portion connected to a sidewall of the discharge chamber and a central portion defining a plurality of apertures, the apertures of the three grids being mutually aligned with each other to form extraction channels for focusing and accelerating the ions in the form of an ion beam; wherein the grids are stacked with each other and assembled into the grid assembly via a screw-nut engagement at peripheral portions thereof, the grids being spaced and electrically insulated from one another, and wherein the central portions of the grids are arranged in an inwardly curved manner toward the interior of the discharge chamber, and thus the ion beam is extracted from the grid assembly in a converged manner to have a sequentially reduced cross-sectional area.

7. The ion source as claimed in claim 6, wherein the discharge chamber has a gas inlet for allowing passage of the ionizable gas thereinto, and an open end where the grid assembly is disposed.

8. A method for applying an ion source in thin film deposition by IAD process, comprising the following steps:
   a) providing a deposition chamber;
   b) disposing a discharge chamber in the deposition chamber, the discharge chamber being adapted for containing an ionizable gas and a plasma resulting from the ionized gas, the discharge chamber defining an open end for a plasma and a gas inlet for allowing passage of the ionizable gas thereinto;
   c) providing a gas source for supplying the ionizable gas into the discharge chamber via the gas inlet;
   d) disposing an actuator in the deposition chamber, the actuator being adapted for ionizing the ionizable gas in the discharge chamber and thus producing the plasma;
   e) disposing an ion beam extraction device at the open end of the discharge chamber, the ion beam extraction device comprising a screen grid kept at anode potential and disposed near the plasma, an accelerator grid kept at cathode potential and spaced from the screen grid, and a decelerator grid being equal to the ground and disposed beyond the accelerator grid, the screen grid, the accelerator grid and the decelerator grid being assembled into the ion beam extraction device via a screw-nut engagement therebetween, the three grids being spaced and insulated from one another and defining a plurality of apertures mutually aligned with each other to form extraction channels for the ion beam, each grid having an inwardly curved configuration toward the interior of the discharge chamber, so as to extract a converged ion beam with a sequentially reduced cross-sectional area; and
   f) disposing a substrate in the deposition chamber for being bombarded by the ion beam to obtain the thin film.

9. The method as claimed in claim 8, wherein the actuator is in the form of a radio frequency coil surrounding the discharge chamber and connected to a high frequency generator for generating a high-frequency electromagnetic field.

10. The method as claimed in claim 8, wherein the substrate is fixed to a rotating fixture for ensuring deposited film uniformity.

11. The method as claimed in claim 8, wherein the discharge chamber and the actuator are surrounded by an outer shell.

12. A grid assembly for an ion source to be disposed at one end of a discharge chamber of the ion source for accelerating ions in the form of an ion beam, the grid assembly comprising a screen grid, an accelerator grid and a decelerator grid, the screen grid being kept at anode potential and disposed near the ions, the accelerator grid being kept at cathode potential and spaced from the screen grid, the decelerator grid being equal to the ground and disposed beyond the accelerator grid, each grid having a curved portion defining a plurality of apertures aligned with those of the other two grids to form extraction channels for the ion beam; wherein the screen grid, the accelerator grid and the decelerator grid are assembled into the grid assembly via a screw-nut engagement therebetween, the three grids being spaced and electrically insulated from one another by insulators disposed therebetween, and wherein, when disposing the grid assembly at said one end of the discharge chamber, the curved portions of the three grids are arranged in an inwardly curved manner toward the interior of the discharge chamber, and thus the ion beam is extracted from the grid assembly in a converged manner to have a sequentially reduced cross-sectional area.

* * * * *